US007499360B2

(12) United States Patent
McCollum et al.

(10) Patent No.: US 7,499,360 B2
(45) Date of Patent: *Mar. 3, 2009

(54) FLASH/DYNAMIC RANDOM ACCESS MEMORY FIELD PROGRAMMABLE GATE ARRAY

(75) Inventors: John McCollum, Saratoga, CA (US); Vidya Bellippady, Cupertino, CA (US); Gregory Bakker, San Jose, CA (US)

(73) Assignee: Actel Corporation, Mountain View, CA (US)

( * ) Notice: Subject to any disclaimer, the term of this patent is extended or adjusted under 35 U.S.C. 154(b) by 96 days.

This patent is subject to a terminal disclaimer.

(21) Appl. No.: 11/619,547

(22) Filed: Jan. 3, 2007

(65) Prior Publication Data

US 2007/0104009 A1    May 10, 2007

Related U.S. Application Data

(63) Continuation of application No. 11/484,244, filed on Jul. 10, 2006, now Pat. No. 7,187,610, which is a continuation of application No. 11/113,286, filed on Apr. 21, 2005, now Pat. No. 7,120,079, which is a continuation of application No. 10/623,111, filed on Jul. 17, 2003, now Pat. No. 6,891,769.

(51) Int. Cl.
   *G11C 7/00* (2006.01)
(52) U.S. Cl. .................. 365/222; 365/189.01
(58) Field of Classification Search ................. 365/222, 365/189.01
See application file for complete search history.

(56) References Cited

U.S. PATENT DOCUMENTS

| 4,408,304 | A |   | 10/1983 | Nishizawa et al. |
| 4,780,849 | A |   | 10/1988 | Nakagawa et al. |
| 5,317,212 | A |   | 5/1994  | Wahlstrom |
| 5,375,086 | A |   | 12/1994 | Wahlstrom |
| 5,600,281 | A |   | 2/1997  | Mori et al. |
| 5,986,958 | A | * | 11/1999 | Voogel ................ 365/222 |
| 6,016,268 | A |   | 1/2000  | Worley |
| 6,137,714 | A |   | 10/2000 | Voogel |

(Continued)

FOREIGN PATENT DOCUMENTS

WO    2005010889 A1    2/2005

OTHER PUBLICATIONS

Supplementary European search report in corresponding EP Application No. 04778193.5 (PCT/US2004/022556, Sep. 9, 2006, pp. 1-3.

(Continued)

*Primary Examiner*—Son Dinh
(74) *Attorney, Agent, or Firm*—Lewis and Roca LLP

(57) ABSTRACT

A circuit for selectively interconnecting two nodes in an integrated circuit device includes a memory array having a plurality of wordlines and a plurality of bitlines. A refresh transistor has a source coupled to one of the plurality of bitlines, a control gate coupled to a dynamic random access memory wordline and a drain. A switching transistor has a gate coupled to the drain of the refresh transistor, a source coupled to a first one of the nodes and a drain coupled to a second one of the nodes. An address decoder for supplies periodic signals to the wordlines and the dynamic random access memory wordline.

9 Claims, 3 Drawing Sheets

U.S. PATENT DOCUMENTS 6,233,188 B1   5/2001   Kai
6,891,769 B2   5/2005   McCollum et al.
7,120,079 B2   10/2006  McCollum et al.
7,187,610 B1   3/2007   McCollum et al.

OTHER PUBLICATIONS

Corresponding PCT/US04/22556 International Search Report and Written Opinion, Dec. 1, 2004, 2 pages.

* cited by examiner

FLASH/DYNAMIC RANDOM ACCESS MEMORY FIELD PROGRAMMABLE GATE ARRAY

CROSS-REFERENCE TO RELATED APPLICATIONS

This application is a continuation of U.S. patent application Ser. No. 11/484,244, filed Jul. 10, 2006, now U.S. Pat. No 7,187,610 which is a continuation of U.S. patent application Ser. No. 11/113,286, filed Apr. 21, 2005, now issued as U.S. Pat. No. 7,120,079, which is a continuation of U.S. patent application Ser. No. 10/623,111, filed Jul. 17, 2003, now issued as U.S. Pat. No. 6,891,769, all of which are hereby incorporated by reference as if set forth herein.

BACKGROUND

1. Field of the Invention

The present invention relates to memory cells in an integrated circuit. More specifically, the invention relates to using a standard transistor as a flash/dynamic random access memory (DRAM) in order to reduce the size of a gate oxide for a memory cell in an integrated circuit.

2. Background

FPGA integrated circuits are known in the art. Typically, an FPGA has an array of logic elements and wiring interconnections with many thousands of programmable interconnect cells so that the FPGA can be configured by the user into an integrated circuit with defined functions. Each programmable interconnect cell, or switch, can connect two circuit nodes in the integrated circuit to make or break a wiring interconnection or to set the function or functions of a logic element.

FPGA devices may be classified in one of two categories. One category of FPGA devices is one-time programmable and uses elements such as antifuses for making programmable connections. The other category of FPGA devices is reprogrammable and uses devices such as transistor switches as the programmable elements to make non-permanent programmable connections.

Reprogrammable FPGA devices include some means, such as static random access memory and dynamic random access memory, for storing programming information used to control the programmable elements. Non-volatile memory devices such as EPROMs, EEPROMs, non-volatile RAM, and flash memory devices have all been proposed for or used to store programming information in the class of FPGA applications.

An ideal memory device optimizes density, preserves critical memory in a nonvolatile condition, is easy to program and reprogram, and is read quickly. Some non-volatile memory devices meet more of the above requirements than others. For instance, EPROMS are high density, however, they have to be exposed to ultra-violet light for erasure. EEPROMS are electrically byte-erasable, but are less reliable and have the lowest density. Flash memory devices, however, are low-cost, high-density, low-power, high-reliability devices resulting in a high-speed architecture.

FIG. 1 is a simplified schematic diagram of a flash memory cell. Flash memory cell 100 comprises a sense transistor 102 and a switch transistor 104. Sense transistor 102 is usually a smaller, minimum-geometry device used for programming. Switch transistor 104 is a larger-geometry device, a pass transistor switch element is used to selectively connect two nodes 116 and 118 in the integrated circuit. Electronically, floating gate 110 is shared by both programming transistor 102 and switch transistor 104. Programming is accomplished with Fowler-Nordheim tunneling. Fowler-Nordheim tunneling is well known in the integrated circuit art and will not be discussed herein to avoid overcomplicating the disclosure and thereby obscuring the present invention.

FIG. 2 is a simplified top-level layout view of the flash memory cell of FIG. 1. As in FIG. 1, flash memory cell comprises a switch transistor 202 and a sense transistor 204.

However, a flash memory transistor cannot be easily scaled with the rest of the process. As is well known to those of ordinary skill in the art, the gate oxide of a flash memory transistor is thick, on the average of 8.5 nm. The CMOS process technology to date provides a junction capacitance of not lower than 1 ff. A flash memory cell with a lower capacitance is impractical.

Hence, there is a need in the art for a memory cell that can scale with the rest of the integrated circuit. There is also a need for a memory cell that has a junction capacitance of lower than 1 ff.

SUMMARY OF THE INVENTION

The present invention addresses the above concerns by providing a flash memory cell using a standard MOS transistor as the switching element for the FPGA interconnect.

A standard MOS transistor is able to store a charge, but the charge decays due to the inability of gate capacitance to maintain the charge. Thus, the present invention uses a memory array to periodically provide a refresh charge to maintain the gate voltage of the transistor at a sufficient level, and thus provides a dynamic refresh to support the standard transistor flash memory cell.

A better understanding of the features and advantages of the present invention will be obtained by reference to the following detailed description of the invention and accompanying drawings, which set forth an illustrative embodiment in which the principles of the invention are utilized.

DETAILED DESCRIPTION

Those of ordinary skill in the art will realize that the following description of the present invention is illustrative only and not in any way limiting. Other embodiments of the invention will readily suggest themselves to such skilled persons.

In this disclosure, various circuits and logical functions are described. It is to be understood that designations such as "1" and or "0" in these descriptions are arbitrary logical designations. In a first implementation of the invention, "1" may correspond to a voltage high, while "0" corresponds to a voltage low or ground, while in a second implementation, "0" may correspond to a voltage high, while "1" corresponds to a voltage low or ground. Likewise, where signals are described, a "signal" as used in this disclosure may represent the application, or pulling "high" of a voltage to a node in a circuit where there was low or zero voltage before, or it may represent the termination, or the bringing "low" of a voltage at the node, depending on the particular implementation of the invention.

Figure 1:
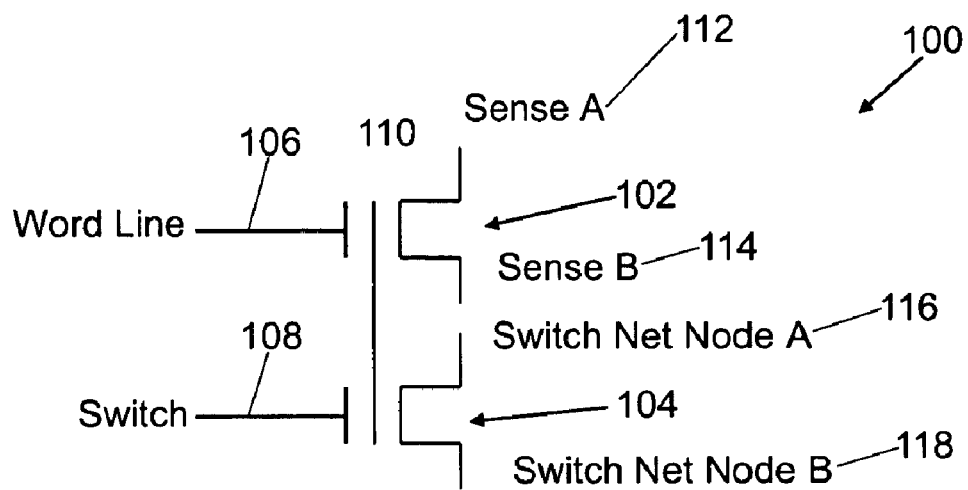
FIG. 1 is a simplified schematic diagram of a flash memory cell.
Figure 2:
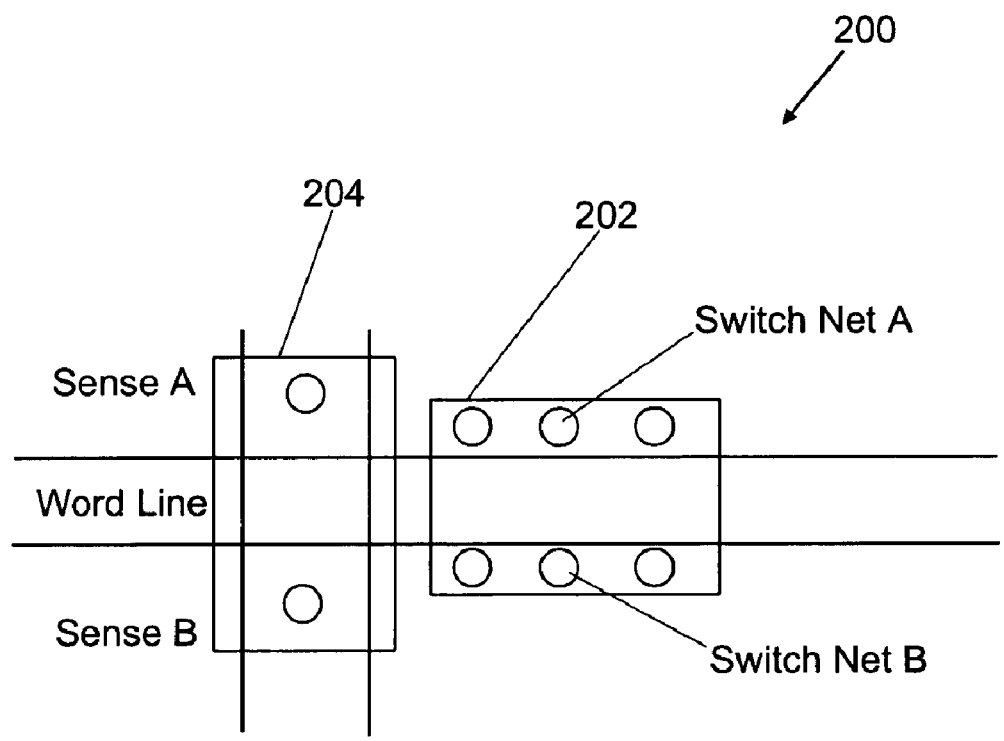
FIG. 2 is a simplified top-level view of the flash memory cell of FIG. 1.
Figure 3:
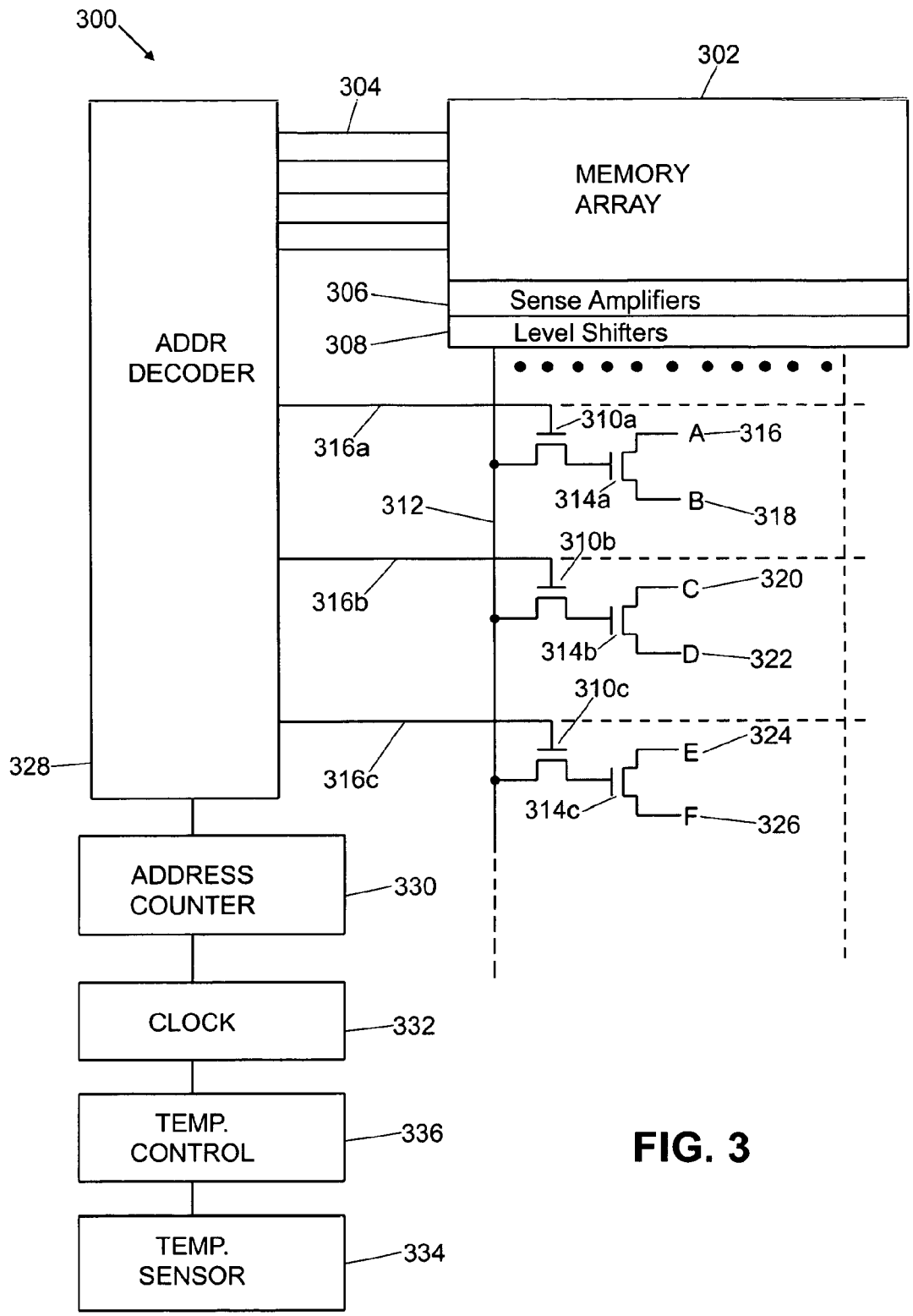
FIG. 3 is a simplified schematic diagram illustrating an embodiment of the memory circuit of the present invention.

FIG. 3 is a simplified schematic diagram illustrating an embodiment of the memory circuit 300 of the present system. Memory circuit 300 of the present invention comprises a memory array 302 having wordlines 304 for addressing the memory. Memory array 302 can be any kind of array known in the art, for example, a flash memory array. Sense amplifiers 306 sense the states of the memory cells addressed by the wordlines and level-shifting circuits 308 shift the output levels of the sense amplifiers as will be described herein. Sense amplifiers and level-shifting circuits are well known in the art.

The outputs of level-shifting circuits 308 drive bitlines or column lines for providing output from the memory. Standard minimum-sized MOS transistors shown at reference numerals 310a, 310b, and 310c are used as refresh transistors and each have their sources coupled to one of the bitlines or column lines shown at reference numeral 312. The transistors 310a, 310b, and 310c each have a drain coupled to the control gate of a different one of switching transistors 314a, 314b, and 314c. Each of the refresh transistors 310a, 310b, and 310c has a control gate coupled to a different dynamic random access word line shown at reference numerals 316a, 316b, and 316c. As persons of ordinary skill in the art will appreciate, dynamic random access word lines 316a, 316b, and 316c are also coupled to the gates of refresh transistors coupled to switching transistors on other bitlines, since for each address provided to memory array 302, a data bit output is provided on each bitline.

Each of the switching transistors 314a, 314b, and 314c has a source and a drain coupled respectively to an interconnect node. The interconnect nodes will be connected together when the switching transistor is turned on. Thus switching transistor 314a is shown having its source/drain terminals connected, respectively, to interconnect node "A" shown at reference numeral 316 and interconnect node "B" shown at reference numeral 318. Similarly, switching transistor 314b is shown having its source/drain terminals connected, respectively, to interconnect node "C" shown at reference numeral 320 and interconnect node "D" shown at reference numeral 322, and switching transistor 314c is shown having its source/drain terminals connected, respectively, to interconnect node "E" shown at reference numeral 324 and interconnect node "F" shown at reference numeral 326. As will be appreciated by persons of ordinary skill in the art, nodes "A" through "F" may be used for all interconnect purposes in an FPGA, including interconnecting interconnect conductors and defining logic module functions.

Memory circuit 300 operates by first using addresses provided on wordlines 304 to access a selected memory cell in the array as is known in the art. The contents of the selected memory cells are provided to sense amplifiers 306 and then to level shifting circuits 308. The outputs of level shifting circuits 308 are used to drive the bitlines, one of which is shown at reference numeral 312. The operation of the switching transistors 314a, 314b, and 314c coupled to bitline 312 will be disclosed in detail herein, and persons of ordinary skill in the art will appreciate that other such switching transistors are coupled to the other bitlines and will operate in the same manner as disclosed for switching transistors 314a, 314b, and 314c.

In order to understand how switching transistors 314a, 314b, and 314c are maintained in a desired state, assume in an illustrative example that the circuit to be implemented in the FPGA requires that interconnect nodes "A" and "B" be connected together, interconnect nodes "E" and "F" be connected together, but interconnect nodes "C" and "D" be unconnected. This means that switching transistors 314a and 314c must be maintained in an "on" state, and switching transistor 314b must be maintained in an "off" state.

Addresses are applied to wordlines 304 from address decoder 328 driven by address counter 330 and clock 332. Decoded drive signals from address counter 328 are also applied to dynamic random access word lines 316a, 316b, and 316c in a synchronized manner. As will be appreciated by persons of ordinary skill in the art, this may be done by employing conventional address-counter circuits.

When the data bit needed to drive switching transistor 314a (in this case a logic "1") appears on bitline 312 in response to its address being asserted on wordlines 304, a logic "1" is also asserted by the address decoder on dynamic random access word line 316a, thus turning on transistor 310a. After a period of time sufficient to charge the gate capacitance of switching transistor 314a, (i.e., the RC time constant of the gate capacitance of the switching transistor 314a and the on-resistance of transistor 310a), transistor 310a is then turned off by returning the voltage on dynamic random access word line 316a at the gate of transistor 310a to zero. The logic-one voltage that was at the bitline 312 during the time transistor 310a was turned on is stored at the gate capacitance of switching transistor 314a, thus turning it on.

In the present example also assume that the data bits for driving switching transistors 314a, 314b, and 314c are stored in consecutive addresses in memory 302. The address counter driving wordlines 304 is incremented and the data bit needed to drive switching transistor 314b (in this case a logic "0") appears on bitline 312 in response to its address being asserted on wordlines 304. A logic "1" is also asserted on dynamic random access word line 316b, thus turning on transistor 310b. Transistor 310b is then turned off by returning the voltage on dynamic random access word line 316b at the gate of transistor 310b to zero. The logic-zero voltage that was at the bitline 312 during the time transistor 310a was turned on is stored at the gate capacitance of switching transistor 314b, thus leaving it turned off.

The address counter driving wordlines 304 is again incremented and the data bit needed to drive switching transistor 314c (in this case a logic "1") appears on bitline 312 in response to its address being asserted on wordlines 304. A logic "1" is also asserted on dynamic random access word line 316c, thus turning on transistor 310c. Transistor 310c is then turned off by returning the voltage on dynamic random access word line 316c at the gate of transistor 310c to zero. The logic-one voltage that was at the bitline 312 during the time transistor 310a was turned on is stored at the gate capacitance of switching transistor 314c, thus turning it on.

The above-described process increments the address counters driving the wordlines and the dynamic random access word lines until the address counters have addressed the data bits for driving each of the switching transistors and then repeats because the charge placed on control gate 306 lasts only a finite amount of time, which may, in a practical embodiment of the present invention, be approximately 1 millisecond. As persons of ordinary skill in the art will recognize, the length of time that the charge placed on the gates of switching transistors 314a, 314b, and 314c will be sufficient to maintain the interconnection depends on the leakage of the circuit. In this regard, it is noted that the level shifting circuits 308 are employed to provide a voltage sufficient to overdrive the gates of the switching transistors to eliminate the Vth drop across the channels of the on-state switching transistors. In one example where the nominal logic-one voltage used in the FPGA logic circuits is about 1.5 volts, the gate-drive voltage placed on the bitlines may be about 3.3 volts. From this disclosure, persons of ordinary skill in the art will readily be able to specify the bitline voltage for a particular design given the operating voltages of the logic circuits and the refresh rate of the switching transistors.

According to one embodiment of the present invention, the temperature of the die containing the FPGA is sensed, e.g., by employing a temperature sensor 334, such as a band-gap reference, and the refresh rate is adjusted as a function of that temperature to take advantage of the temperature-dependent nature of the junction leakage of the switching transistors. Specifically, a slower refresh rate may be employed at lower operating temperatures. As will be appreciated by persons of ordinary skill in the art this may be done by employing a temperature-dependent clock controller circuit 336 that uses the output of the temperature sensor to adjust the frequency of the clock 332 used to drive the address counter 330 for the wordlines and dynamic random access word lines. The temperature-to-refresh-rate transfer curve will be specific to the MOS technology employed. The concept of adjusting the parameters of a circuit based on temperature is well known. The particular circuit used will be dependent on the actual integrated circuit in which it will be used and design of a particular circuit 336 for an actual integrated circuit is a trivial exercise for persons of ordinary skill in the art.

Figure 4:
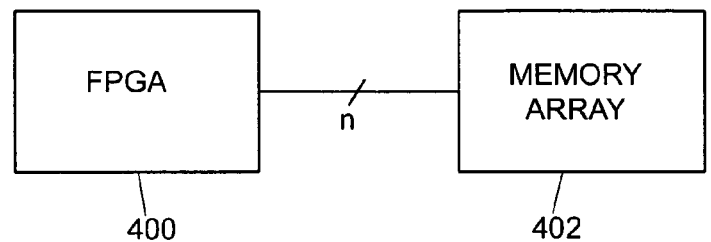
FIG. 4 is a simplified block diagram illustrating one arrangement of the memory circuit of the present invention.

Referring now to FIG. 4, a simplified block diagram illustrates a first arrangement of the memory circuit of the present invention. As shown in FIG. 4, an FPGA integrated circuit 400 and a separate memory array 402 may be provided as separate packaged integrated circuits or as separate integrated-circuit die that are interconnected using a plurality of interconnect wires ("n" such wires are shown in FIG. 4). The FPGA includes the refresh transistors and the switching transistors. While this arrangement may be used, it has the disadvantage of requiring the use of "n" I/O pads on the FPGA integrated circuit.

Figure 5:
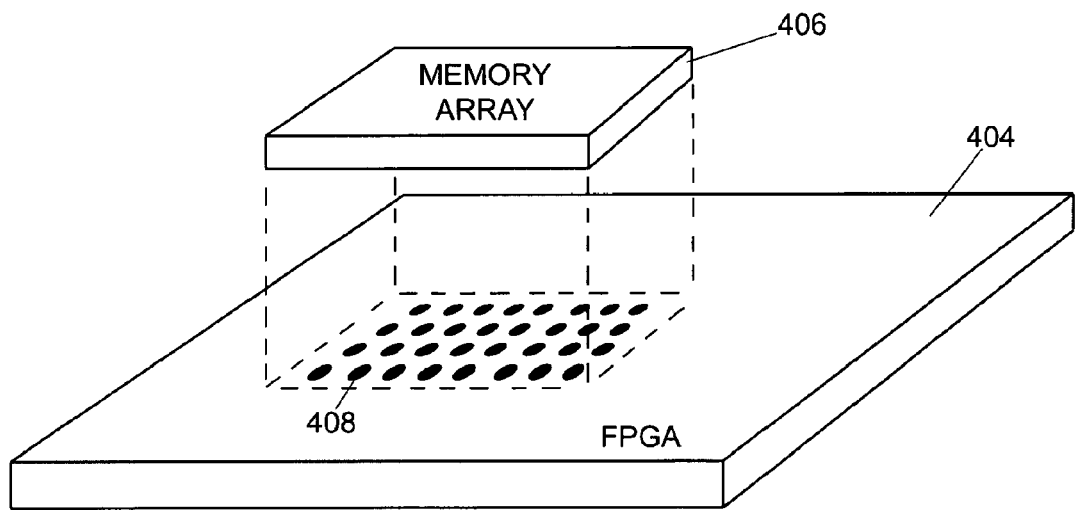
FIG. 5 is a simplified block diagram illustrating another arrangement of the memory circuit of the present invention.

Referring now to FIG. 5, an FPGA integrated circuit die 404 and a separate memory array die 406 may be provided and interconnected by employing face-to-face die mounting technology wherein the die are contacted with each other. Arrays of boding pads (shown generally at reference numeral 408) on the contacting faces of the two die are placed in alignment and are bonded together. The arrangement of FIG. 5 has the advantage of avoiding the use of the normal I/O pads on the FPGA die for interconnecting the memory array while at the same time providing a much-reduced capacitance at each of the connections between the FPGA die and the memory array die. This allows for higher speed clocking of the memory array, thus increasing the size of memory (and the number of interconnects) that can be used in this system at any given refresh rate.

It should be understood that various alternatives to the embodiments of the disclosed method and apparatus described herein may be employed in practicing the disclosed method and using the disclosed apparatus. It is intended that the following claims define the scope of the disclosed method and apparatus and that methods and structures within the scope of these claims and their equivalents be covered thereby.

What is claimed is:

1. A method for interconnecting two nodes in an integrated circuit device comprising:
   storing a charge representing an on-status bit on a gate capacitance of a switching transistor coupled between the two nodes; and
   periodically refreshing said charge, wherein periodically refreshing said charge is performed at a periodic interval that is a function of temperature of a die on which said circuit is disposed and comprises periodically coupling a voltage representing said on-status bit to said gate capacitance of said switching transistor through a refresh transistor.

2. The method of claim 1, wherein coupling a voltage representing said on-status bit comprises:
   retrieving a signal representing said on-status bit from a memory; and
   converting said signal into said voltage.

3. The method of claim 1, wherein said switching transistor comprises a gate coupled to the drain of said refresh transistor, a source coupled to one of the two nodes, and a drain coupled to the other of the two nodes.

4. The method of claim 1, wherein said refresh transistor comprises a source coupled to one of a plurality of bitlines, a control gate coupled to one of a plurality of dynamic random access memory wordlines, and a drain.

5. A method for interconnecting N pairs of nodes in an integrated circuit device comprising:
   for each of said N pairs of nodes, storing a charge representing an on-status bit on a gate capacitance of a switching transistor coupled between the pair of nodes; and
   periodically refreshing each said charge, wherein periodically refreshing said charge is performed at a periodic interval that is a function of temperature of a die on which said circuit is disposed and comprises periodically coupling a voltage representing said on-status bit to said gate capacitance of each said switching transistor through a separate refresh transistor.

6. The method of claim 5, wherein periodically coupling a voltage comprises periodically coupling a voltage having a magnitude sufficient to turn on each said switching transistor without a Vth drop.

7. The method of claim 5, wherein coupling a voltage representing said on-status bit comprises:
   retrieving a signal representing said on-status bit from a memory; and
   converting said signal into said voltage.

8. The method of claim 5, wherein said switching transistor comprises a gate coupled to the drain of said separate refresh transistor, a source coupled to one of the nodes in the pair of nodes, and a drain coupled to the other node in the pair of nodes.

9. The method of claim 5, wherein said separate refresh transistor comprises a source coupled to one of a plurality of bitlines, a control gate coupled to one of a plurality of dynamic random access memory wordlines, and a drain.

* * * * *